(12) United States Patent
Karns et al.

(10) Patent No.: US 12,212,041 B2
(45) Date of Patent: Jan. 28, 2025

(54) ELECTRONIC EXTENSION MODULE FOR ELECTRIC PUMP

(71) Applicants: Stephan Karns, Dortmund (DE); Markus Brockmann, Dortmund (DE); Daniel Bencak, Dortmund (DE); Arno Kefenbaum, Dortmund (DE); Timo Starkmuth, Dortmund (DE); Herve Bouilly, Dortmund (DE); Franck Terrien, Dortmund (DE); Dirk Nowak, Dortmund (DE); Peter Kleine-Rumberg, Dortmund (DE)

(72) Inventors: Stephan Karns, Dortmund (DE); Markus Brockmann, Dortmund (DE); Daniel Bencak, Dortmund (DE); Arno Kefenbaum, Dortmund (DE); Timo Starkmuth, Dortmund (DE); Herve Bouilly, Dortmund (DE); Franck Terrien, Dortmund (DE); Dirk Nowak, Dortmund (DE); Peter Kleine-Rumberg, Dortmund (DE)

(73) Assignee: WILO SE, Dortmund (DE)

( * ) Notice: Subject to any disclaimer, the term of this patent is extended or adjusted under 35 U.S.C. 154(b) by 486 days.

(21) Appl. No.: 17/557,213

(22) Filed: Dec. 21, 2021

(65) Prior Publication Data

US 2022/0196020 A1 Jun. 23, 2022

(30) Foreign Application Priority Data

Dec. 23, 2020 (LU) .......................... 102364

(51) Int. Cl.
*H01Q 1/22* (2006.01)
*F04D 1/00* (2006.01)
(Continued)

(52) U.S. Cl.
CPC .............. *H01Q 1/2291* (2013.01); *F04D 1/00* (2013.01); *F04D 29/007* (2013.01); *F04D 29/62* (2013.01);
(Continued)

(58) Field of Classification Search
CPC .......... H01Q 1/2291; H01Q 1/22; F04D 1/00; F04D 29/007; F04D 29/62;
(Continued)

(56) References Cited

U.S. PATENT DOCUMENTS 9,979,134 B2 * 5/2018 Yu ...................... H01R 13/6585
2009/0124111 A1 * 5/2009 Rabotti .................. H02K 5/225
439/358

(Continued)

FOREIGN PATENT DOCUMENTS

EP 351272 B1 5/1994
EP 2975738 A1 * 1/2016
(Continued)

*Primary Examiner* — Justin M Kratt
(74) *Attorney, Agent, or Firm* — Andrew Wilford

(57) ABSTRACT

A plug-in electronic expansion module for pump electronics of a centrifugal pump for expanding the pump electronics with at least one additional function has a housing having a lower face and connecting formations thereon for attachment to a pump housing of the pump electronics. Electronics in the module housing provide the additional function. A base is provided on the lower face, and an electrical interface connected to the pump electronics includes a flat support projecting tongue-like from the base on the lower face of the module housing through an opening in the pump housing and carrying contact-forming electrical traces.

20 Claims, 2 Drawing Sheets

(51) Int. Cl.
*F04D 29/00* (2006.01)
*F04D 29/62* (2006.01)
*H01R 12/71* (2011.01)
*H01R 13/621* (2006.01)
*H02K 11/00* (2016.01)
*H05K 1/02* (2006.01)
*F04D 13/06* (2006.01)
*H01R 12/70* (2011.01)
*H01R 13/502* (2006.01)
*H01R 13/62* (2006.01)
*H02K 7/14* (2006.01)

(52) U.S. Cl.
CPC ........... *H01R 12/71* (2013.01); *H01R 13/621* (2013.01); *H01R 13/6215* (2013.01); *H02K 11/0094* (2013.01); *H05K 1/0215* (2013.01); *H05K 1/0298* (2013.01); *F04D 13/0686* (2013.01); *F05D 2230/51* (2013.01); *H01Q 1/22* (2013.01); *H01R 12/7076* (2013.01); *H01R 13/502* (2013.01); *H01R 13/62* (2013.01); *H02K 7/14* (2013.01); *H02K 2213/03* (2013.01); *H05K 1/0213* (2013.01); *H05K 1/0296* (2013.01)

(58) Field of Classification Search
CPC ... F04D 13/0686; H01R 12/71; H01R 13/621; H01R 13/6215; H01R 12/7076; H01R 13/62; H01R 13/502; H02K 11/0094; H02K 7/14; H02K 2213/03; H05K 1/0215; H05K 1/0298; H05K 1/0213; H05K 1/0296; F05D 2230/51
See application file for complete search history.

(56) References Cited

U.S. PATENT DOCUMENTS

2018/0335038 A1 11/2018 Vestergaard Kragelund et al.
2020/0028291 A1* 1/2020 Lee .................... H01R 12/7076

FOREIGN PATENT DOCUMENTS

| WO | WO-2018190027 A1 | * | 10/2018 | ............. B60K 35/00 |
| WO | WO-2021061127 A1 | * | 4/2021 | ........... H01Q 1/2291 |
| WO | WO-2022060077 A1 | * | 3/2022 | |

\* cited by examiner

Fig. 1
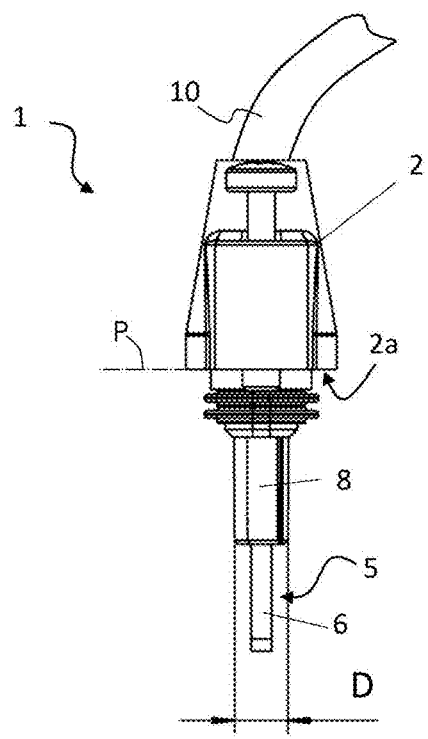
Fig. 1A
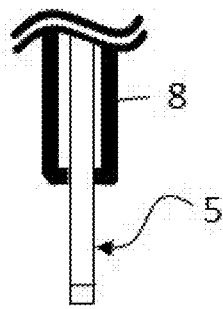
Fig. 2
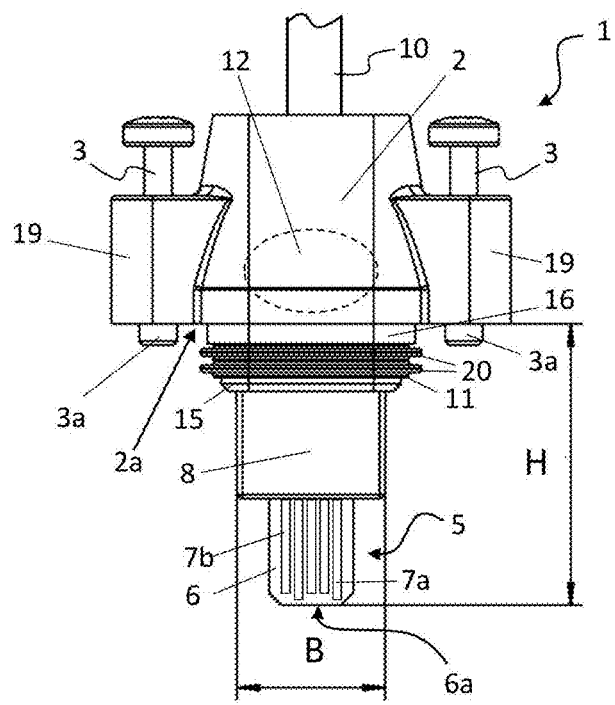
Fig. 3
Fig. 4
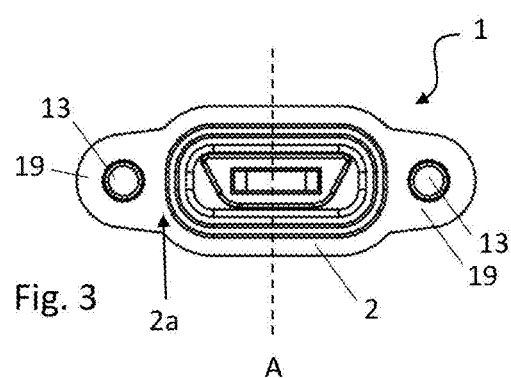

ELECTRONIC EXTENSION MODULE FOR ELECTRIC PUMP

FIELD OF THE INVENTION

The present invention relates to an electric pump. More particularly this invention concerns a function module for an electric pump.

BACKGROUND OF THE INVENTION

Function modules for expanding the functional scope of a centrifugal pump unit are known. For example, WILO SE part item number 2097810 function module, also called an IF module (IF=Interface), for their centrifugal pump units "Stratos" series and of the dry-run type that turn the control electronics of the pump with a serial communication interface for BACnet to connect the centrifugal pump to be able to connect to building automation. The IF module provides both the electrical connection (RS485) for the connection of the pump to a BACnet as well as the necessary communication protocol. WILO SE offers a functional module of this kind under the part number 2097808 that is a corresponding extension of the pump using the industry standard MOD-BUS. Thus, a user can use the centrifugal pump unit optionally supplemented and tailored to his needs and the daily needs of the communication infrastructure. The two functional modules are connected to the same electrical interface of the centrifugal pump unit.

Meeting current and future customer needs requires steady growth of the functional scope of centrifugal pump units and their pump electronics especially with regard to wired or wireless communication interfaces. Due to continuous development of existing communication technologies (for example mobile communications: 2G (GSM), 3G (UMTS), 4G (LTE Advanced), 5G Bluetooth, Bluetooth Low Energy) new technologies (ZigBee, enOcean, RFID), there is also a need in the market for rapid availability of function-expanded centrifugal pump units on the market, and due to the necessary product development time and in particular the required product certification, especially for radio-based communication technologies, this need is difficult to meet. In addition, there is the desire to be inexpensive despite the increased functionality.

A solution that meets all of these requirements consists in defining functions or functional groups modularly or in the form of electronic expansion modules that augment the main product or the centrifugal pump unit or its added pump electronics. This reduces the development time and the duration to availability in the market because the development is mainly based on the electronic expansion modules. Furthermore, no recertification of the main product is required, as the certification is limited to the electronic expansion modules. This means that new technologies can be combined or integrated with the main product in a timely manner. Since with extension modules a needs-based, targeted supplying of the main product with certain functions or functional groups cannot be implemented, the required functionalities are omitted so that there is an overall cost advantage.

The externalization of functions or functional groups in electronic expansion modules makes certain demands on the electrical interface between the electronic extension module and the pump electronics as well as the assembly or upgrading of the expansion module. Among other things, the aspects of operational safety, robustness, susceptibility to errors, protection against accidental contact, insulation, tightness, handling and attachment have to be considered. Furthermore, a uniform interface for different expansion modules is desirable so that depending on needs different extension modules have to be able to be connected to the same electrical interface of the pump electronics.

OBJECTS OF THE INVENTION

It is therefore an object of the present invention to provide an improved electronic expansion module for pump electronics.

Another object is the provision of such an improved electronic expansion module for pump electronics that overcomes the above-given disadvantages, in particular that expands the pump electronics with to provide at least one additional function that meets the above-described requirements and washing takes into account.

SUMMARY OF THE INVENTION

A plug-in electronic expansion module for pump electronics of a centrifugal pump has according to the invention a module housing having a lower face and connecting formations thereon for attachment to a pump housing of the pump electronics, and electronics in the module housing providing the additional function. A base is provided on the lower face, and an electrical interface connected to the pump electronics includes a flat support projecting tongue-like from the base on the lower face of the module housing through an opening in the pump housing and carrying contact-forming electrical traces.

The above-described expansion module is particularly easy to install because it can be plugged in and also meet the requirements for operational safety, robustness, susceptibility to faults, protection against contact, insulation and tightness. The additional function can include for example radio-based communication technology. This communication technology can be, for example, Bluetooth, in particular Bluetooth Low Energy (BLE), WLAN (Wireless Local Area Network according to IEEE 802.11 standard) or a cellular network (according to a cellular standard for 3G, 4G, 5G cellular networks of 3GPP, especially NB-IoT|over LTE and/or 5G networks). This has the advantage that the centrifugal pump with a radio-based communication interface and can be used without the need to carry out appropriate certification of the pump electronics. Since only the expansion module with the radio-based communication technology must be certified, the overall time until new pump models are available on the market is reduced. It should also be borne in mind that an expansion module can be used for different pump models or variants and only needs to be certified once for centrifugal pumps with an integrated radio interface, one for each model variant.

The additional function can alternatively be a wired communication technology, in particular Modbus, BACnet, LIN bus or Ethernet. According to another alternative, the additional function can be a sensor system, an actuator system or an electronic memory module. The sensor technology can be formed by one or more sensors, for example for detecting a temperature outside the centrifugal pump, the humidity, vibrations (acceleration sensor) of the centrifugal pump or a noise-detecting microphone. The actuator can be, for example, a relay that has a potential-free contacts so the pump electronics can control an external device. The memory module can, for example, serve as a data logger. In this way, the pump electronics can transfer data from the centrifugal pump in the expansion module, for example operating data such as flow rate, power consumption etc., or information about the occurrence of errors. As an alternative or in addition, the memory module can support an operating configuration or a software update for the centrifugal pump that the expansion module in the pump electronics. According to the invention, the electrical interface serves for pluggable electrical connection of the expansion module with the pump electronics. Although this already implies a certain mechanical stability between expansion module and pump electronics, it is beneficial to withstand any stress by mechanical forces that may affect the housing of the expansion module to protect the electrical contacts and avoid impairment of the contacting or even damage to the electrical interface or the to avoid corresponding interface problems on the part of the pump electronics. This is reached by the connection formations in that a fixed fixation of the expansion module on pump electronics housing is guaranteed. This is done as intended on its outside so that no space has to be provided for the expansion module inside the housing and the dimensions of the housing can therefore be small.

The connection formations can preferably be configured such that the extension module can be attached to the housing of the pump electronics so that it can also be removed again if necessary. It may possibly be replaced by another expansion module, be it due to a repair-related replacement of the expansion module, a function change or a function upgrade. The replacement expansion module can have a different function from that of the previous extension module, an additional function, or the same function in a more modern version (Upgrade). The connection formations can, for example, be screw fasteners including at least one screw. To protect the electrical interface from torque, preferably at least two screws serve to secure it in place. Thus, the expansion module is supported by the fasteners and also protected against twisting. Suitably these are two screws right next to it, especially in alignment with the electrical interface. This has the advantage that the housing of the expansion module in one design variant has minimal lateral dimensions. Preferably the screw or screws are captive screw so that they cannot be removed from the housing of the expansion module even when separated. As already stated, a core aspect of the invention is a uniform electrical interface for different extension modules, i.e. extension modules with different additional functions. Depending on the additional function or functions, the extension modules differ not only functionally, but also structurally in terms of their shape and/or Dimensions. So there can be at least one expansion module with a first enclosure size and another expansion module with a second enclosure size that is greater than the first walking size. The assembly or the spacing of the two screws relative to the electrical interface determines the lower limit of the lateral housing dimensions, which in the case of an assembly of the two screws in an electrical interface of minimal size.

In the case of a structurally small extension module, screws are used as the connecting formations for sufficient stability, whereas for larger expansion modules in addition, or at least as an alternative to the screw connection, further connection formations are provided between the expansion module and the housing of the pump electronics that are at a greater spacing from the electrical interface than the screws. Preferably the connection formations are snugly fitting locking elements that are on the lower face of the housing and project through respective openings into the pump electronics housing.

The locking elements can be blocks or pins projecting from the lower face of the housing. In principle, their cross-section can be round, oval, rectangular or square.

The locking elements can have latching elements and extend behind openings in the pump electronics housing. This creates a self-locking mechanism so that just plugging the expansion module into the pump electronics housing creates a fixed, stable assembly. Further steps for securing the expansion module are therefore not required, which makes handling especially simple.

To easily connect the locking elements to the pump electronics housing and to be able to separate them again, it is advantageous if the locking elements are held in position by a blocking member on the pump electronics housing so that they are no longer displaceable against the direction of attachment of the expansion module and can be removed from the locking position. For this purpose, the locking elements each have a recess for positively receiving this blocking member. Plugging the expansion module onto the pump electronics housing can move the blocking member from a release position into positive locking with the locking elements causing blocking, for example by moving or pivoting the blocking member. The blocking member is thus displaceable or on the part of the pump electronics housing pivotably.

The number of locking elements can be at least two, preferably four. Ideally, the locking elements are arranged in a rectangle so that a symmetrical mounting of the expansion module on the pump electronics housing is achieved.

At least one locking element preferably extends farther from the lower face of the housing than the other locking elements. Thus, this element that projects farther from the lower side is first to engage when the expansion module is plugged in and acts as a guide that prevents the extension module from tilting or misaligning and would therefore ensure an aligned and damage-free insertion of the electrical interface into the respective electrical counter interface of the pump electronics. The holes in the pump electronics housing through which the locking elements are guided correspond in size and shape to the outer surfaces of the locking elements so that there is a form fit. Ideally, at least the element that projects farther from the lower face of the housing has a non round cross-section so that the corresponding form fit prevents twisting. To enable the locking elements to be inserted into the holes and in order to further simplify the plugging in of the expansion module, the remote free ends of the locking elements are beveled or conical. This ensures correct alignment of the expansion module relative to the housing of the pump electronics. Lateral offset is prevented and the expansion module is centered.

According to the invention, the electrical interface forms a plug. By projecting significantly from the lower face of the housing, the support element can engage contacts deep inside the housing of the pump electronics. Preferably the spacing between the free end of the support element remote from the lower face of the housing is at least 20 mm. This means that the internal contacts when the expansion module is not attached are protected against contact. Further protection can be provided by a blind plug that is used to close the hole in the pump electronics housing when the attached expansion module which the electrical interface is not plugged in.

It makes sense to have the opening in the pump electronics housing through which the electrical interface is inserted, only slightly larger than the base from which the support element projects. In order to achieve a high level of protection against contact with the mating contacts, a width of the base is less than 14 mm, in particular less than 12 mm, and/or the thickness of the base smaller than 6 mm, in particular smaller than 4.5 mm.

The fact that the contacts of the electrical interface are conductor traces on the flat support element, so the contacts take up little space. The support element can be made comparatively narrow overall. The support element projects from the base with a length that is greater than its width so that the support element is tongue-shaped. The contacts on the support element are conductor traces in addition, so it is positionally secure so that, in comparison to the above contact pins, it moves when it is inserted and the expansion module cannot be bent. The conductor traces can only be on one flat face or on both flat faces of the support element. Thus, the electrical interface, if necessary, can have more or fewer contacts without their shape and dimensions being changed.

The contacts advantageously include first electrical contacts for supplying power to the electronics inside the expansion module and second electrical contacts for data transfer. The extension module is thus supplied with current by the pump electronics so that the expansion module basically does not need an additional power supply connection or a battery. However, in one design variant for safety reasons a battery and/or a power supply connection can be provided on the expansion module. The data transmission contacts are used to transmit data in the form of electrical signals between the expansion module and the pump electronics. Depending on the additional function, this data transmission can be unidirectional or bidirectional, from the expansion module to the pump electronics. It is an advantage if at least one of the electrical contacts is closer to an edge of the free end of the support element, than the other contacts, and this at least one electrical contact is a ground contact. This causes this one grounded contact close to the edge to make first contact when the extension module is plugged. This ensures that electrostatic potentials are dissipated before contacting the data transmission contacts. The risk of damage to an electronic component of the expansion module is thereby minimized. Furthermore, the ground potential is established in the electronics before data transmission contacts are contacted.

Preferably two of the electrical contacts are closer to the edge of the free end of the flat support element than the other contacts so that one of these two contacts is the ground contact and the other is a power-supply contact. Between these two contacts there is then a supply voltage (SELV) during normal operation and the electronics of the expansion module are supplied. This ensures that when the expansion module is plugged in a defined voltage exists in the electronics before data transmission contacts are contacted.

In one embodiment, the support element can be a printed-circuit board. This is easy and inexpensive to manufacture with the technology known for printed-circuit boards and has only a small thickness. The contacts to be contacted by the pump electronics fit with mating contacts of a board-edge connector that fits the free end of the support element in the manner of a mouth to grip positively and nonpositively and at the same time engage the contacts of the electrical interface by resilient counter-contacts. This creates an operationally reliable electrical connection.

In one variant, the housing of the expansion module can include a body of potting material in which the electronics are encapsulated. This means that the electronics are protected from dust and water protected, whereby at least the degree of IP65 protection is attained. In addition, this potting serves for cooling the electronics, since the electronics encased in the potting compound and passes its heat directly to the potting compound. Also such construction transmits vibration directly to the electronics so that no resonance with a natural frequency different from the vibrations can arise in electrical contact point and/or electronic components of the electronics of the expansion module.

In another embodiment variant, the housing of the expansion module can have two or three sides that delimit a hollow interior in which the electronics are inserted. For example, the housing consists of two housing shells placed one on top of the other, or a trough-like base part and a cover that closes it, or from a base and a hood-like cover element covering it.

The base from which the support element extends between the electrical interface, to be more precise, between the freely accessible section of the door element and the housing. Viewed differently, the support element extends through the base into the interior of the housing of the expansion module where the electronics are electrically contacted. The base thus serves to mechanically stabilize the support element.

In a preferred embodiment, the base is unitary or integral with the lower face of the housing. In other words, the base is part of the housing. Thus, there is no need to seal a gap between the base and housing in a design variant in which the lower face of the housing has an opening through which the electrical interface including the base extends. The unitary construction of the base and housing also gives the electrical interface more stability.

According to one design variant, the base is hollow or tubular and the support element extends through the base. The assembly of the electronics and the support element within the housing of the expansion module is therefore particularly simple. In this case, the base serves as a guide and ensures correct parallel alignment.

It is advantageous if the support element is cast or potted in the base, i.e. is part of the plastic material forming the base. Thus no moisture and no dust can move along the support element into the interior of the housing of the expansion module or vice versa from the housing of the pump electronics. There is a synergy of this embodiment variant in connection with the overmolding of the electronics of the expansion module, as in this case the support element and the electronics can be potted at the same time, i.e. in a common process step.

The base preferably has at least on upper end remote opposite from its lower free end, a simply symmetrical, preferably a trapezoidal cross-section. This in technical jargon a poka-yoke design that ensures that the expansion module is plugged in with the correct orientation and thus prevents incorrect assembly, at least if this has not already been achieved by the connecting formations.

In order to seal the opening in the housing of the pump electronics, the base of the housing carries a sealing ring near its upper end close to the housing. In the assembled state of the expansion module this sealing ring fits inside the opening in the pump electronics housing. The sealing ring can for example be molded onto the base so that it is fixed in place and can neither slip nor get lost. An elastomer can be used for this purpose. In one embodiment, this plastic can also be used to fill the cavity in the base and thus the gap or gaps between the base element and the inside of the base are to be sealed tightly. To improve the sealing, this ring can have two parallel sealing lips.

The invention also relates to a centrifugal pump with pump electronics and an expansion module according to the invention, which is attached to the pump electronics. As already mentioned, there can be at least a first expansion module according to the invention with a first housing size and a second expansion module according to the invention with a second different size, whereby the second walking size is larger than the first walking size. More precisely, the base area is the lower face of the case of the first expansion module larger than the base area of the lower face of the housing of the second expansion module. Nevertheless, according to the invention, the electrical interfaces are this first and second expansion module identical in such a way that either the first or the second expansion module can be plugged into the pump electronics.

This also makes sense for the connection formations, especially the assembly of the locking elements in relation to the electrical interface. The connection formations are formed, for example, by four locking elements in or near the corners of the lower side of the housing of the smaller first expansion module, whereas in the second expansion module due to its structurally larger housing at least two of the locking elements are offset back from the corners of the Lower face of this housing.

Thus, the subject matter of the invention is also a set consisting of at least a first and a second expansion module of the above-described type, in which the base surface of the lower face of the first expansion module is larger than the base of the lower face of the second expansion module, but the electrical interface and the spatial arrangement of the locking elements related to the electrical interface in the two expansion modules identical.

BRIEF DESCRIPTION OF THE DRAWING

The above and other objects, features, and advantages will become more readily apparent from the following description, reference being made to the accompanying drawing in which:

FIGS. 1 and 2 are side and front views of a first embodiment of the invention;

FIG. 1A is a large-scale detail view of FIG. 1;

FIGS. 3 and 4 are bottom and top views of the first embodiment;

SPECIFIC DESCRIPTION OF THE INVENTION

Figure 5:
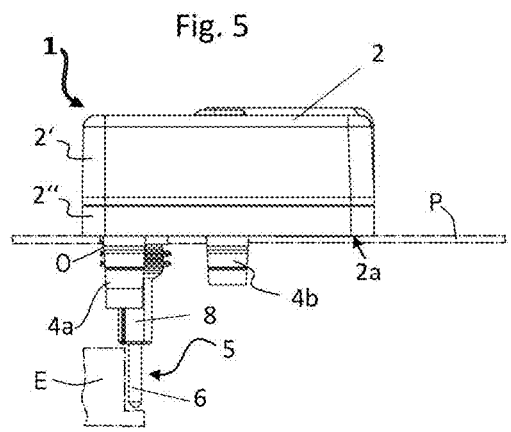
FIGS. 5 and 6 are side and front views of a second embodiment of the invention.

The extension module 1 according to the invention comprises a module housing 2 externally connected to an outside face of a pump housing P of the pump electronics E (FIG. 5) by connecting formations 3 shown here consisting of two captive screws 3 in respective passages or bores 13 that each extend through a respective side wing 19 of the housing 2. In FIG. 2, outer ends 3a of the screws 3 project from the housing 2. The diameters of the screws 3 at these ends 3a are greater than in the section between the housing 2 and the heads of the screws so that the screws 3 cannot move upward out of the holes 13.

The expansion module 1 has module electronics 12 that are accommodated in the module housing 2 and provide the additional function for the pump electronics E. The electronics 12 comprise electrical and/or electronic components, preferably on a printed-circuit board. The electronics 12 is wholly encapsulated in the housing 2. A cable 10 extends into the housing 2 on the side facing away from the pump electronics E. It is also sealed with respective to the housing 2.

The expansion module 1 further comprises an electrical interface 5 conductively connected to the module electronics 12 for plug-in electrical connection of the expansion module 1. This interface 5 for the pluggable electrical connection of the expansion module 1 to the pump electronics projects from the lower face 2a of the housing 2 in order to be plugged through an opening (O in FIG. 5) in the pump electronics housing P. The electrical interface 5 comprises contacts 7a, 7b in the form of parallel conductive traces on a flat support element 6, which is a printed-circuit board and projects tongue-like from a base 8 from a lower face 2a of the housing 2. The electrical interface 5 thus forms a connector. The conductor traces or contacts 7a, 7b are formed here on only one flat side of the support element 6 but in another embodiment they can be present on both flat sides.

The total height H between the lower face 2a of the housing 2 and the end of the support element 6 is between 22 mm and 23 mm. Thus the contacting of the electrical interface 5 by corresponding mating contacts, preferably in the form of a circuit board edge connector, is deep inside the housing P of the pump electronics E. The proportion of the base 8 to the total height H is at least 50%, preferably between 60% and 65%.

As shown in particular in FIGS. 1 and 3, the two screws are located directly adjacent to, or more precisely in alignment with and flank the electrical interface 5, more precisely in alignment with the electrical interface 5.

The contacts 7a, 7b comprise first electrical contacts 7a for energizing the electronics 12 inside the expansion module and second electrical contacts 7b for data transmission. Thus, power is supplied to the expansion module 1 by the pump electronics E. The contacts 7b are used for the bidirectional transmission of data in the form of electrical signals between the expansion module 1 and the pump electronics. As can be seen in FIG. 2 the first electrical contacts 7a for powering the electronics 12 extend right up to the end edge 6a of the housing element 6 remote from the housing 2, farther than the data transmission contacts 7b. In this case, one of the first electrical contacts 7a forms a ground contact so that when the expansion module 1 is plugged in, the ground, then the supply voltage (SELV), and finally the data lines are connected.

The front end or edge 6a of the support element 6 is chamfered on both sides as well as at its faces in order to facilitate insertion into the mating connector on the pump electronics E, e.g. a board-edge connector.

The base 8 is integral with the housing 2 so that there is no gap or seam between the base 8 and the housing 2. The support element 6 is cast in the base 8, i.e. potted by the plastic material forming the base 8. It extends through the base 8 into the interior of the housing 2 of the expansion module 1, where it electrically contacts the electronics 12. A width B of the base 8 is less than 12 mm. Furthermore, a thickness D of the base 8 is less than 4.5 mm. The support element 6 projects from the base 8 through a spacing greater than its width so that the support element 6 has an overall tongue shape.

The base 8 consists, strictly speaking, of a main part 8 from which the supporting element 6 projects, a foot 15 projecting laterally, in particular on all sides, in relation to the main part 8 and a rim 16 that projects laterally, in particular in all directions, from the main part 8 is connected directly to the housing 2. In other words, the base foot 15 merges into the base foot 16 and the latter into the housing 2. The base 8 thus widens in the direction of the housing 2 in two steps.

FIG. 3 shows that the base 8 has only a single symmetrical cross-section at its end remote from the housing. Thus, there is only mirror symmetry with respect to a single plane A. More specifically, the main part of the base 8 has a substantially trapezoidal cross-section so that there is a single orientation for connecting the extension module 1 to the pump unit.

In order to seal the opening in the housing of the pump electronics, the base 8 has a sealing ring 11 on the end, more precisely at the outer circumference of the base 15, with two parallel sealing lips 20. The sealing ring 11 extends to the step-like transition at which the base foot 15 the base foot 15 merges into the base 16. In the assembled state of the extension module 1, the sealing ring 20 is in contact with the inside of the opening in the pump electronics housing.

While FIGS. 1 to 4 show an extension module 1 with a first housing size, FIGS. 5 to 8 show a second extension module 1 according to the invention with a second the second housing size larger than the first housing size. Nevertheless, the electrical interfaces of these two extension modules 1 are identical in such a way that either the first or the second extension module 1 can be plugged into the same interface of the pump electronics. Since the electrical interface 5, including the parts 8, 15, 16 and the sealing ring 11 are identical to the first embodiment, reference is made in this respect to the description above. The second expansion module 1 of the invention extends the pump electronics by an additional function in the form of a radio interface, in particular Bluetooth, WLAN or mobile radio.

The housing 2 of FIGS. 5-8 is essentially box-shaped and is intended to be attached to the outside of the pump electronics housing P. Its height is less than its length and width. The housing 2 consists of an upper part 2' and a lower part 2', between which a hollow interior is formed in which the electronics 12 are inserted. The lower part 2" forms only a flat bottom. In contrast, the upper part 2' is hood-like and covers the electronics 12. The upper and lower parts 2' and 2" are positively connected to one another, in particular latched together. The base 8 is formed integrally with the lower part 2. It is also hollow and the support element 6 is inserted through the base 8. The assembly of element 6 and electronics 12 is thus carried out in the direction of the vertical extension of the module 1.

Figure 6:
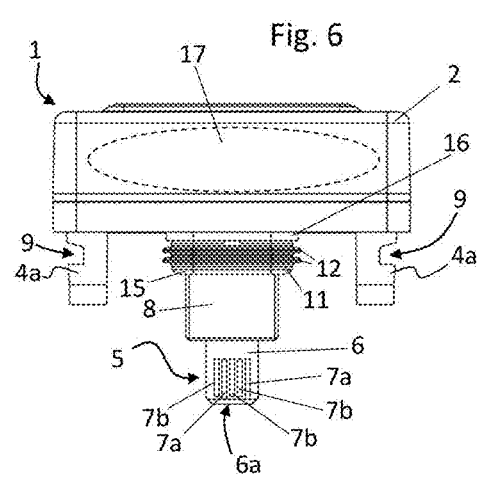
Figure 5A:
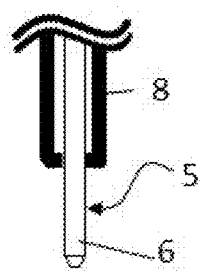
FIG. 5A is a large-scale detail view of FIG. 5.
Figure 7:
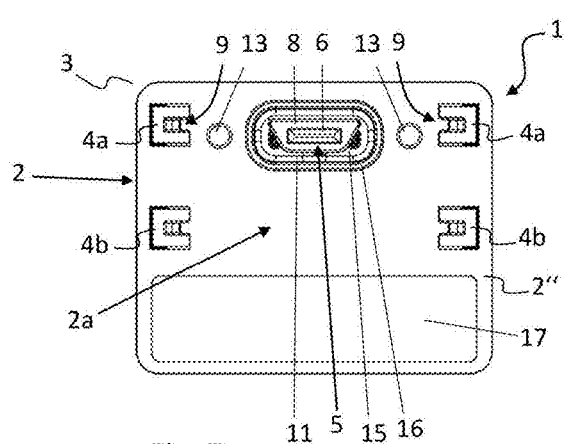
FIGS. 7 and 8 are bottom and top views of the second embodiment.
Figure 8:
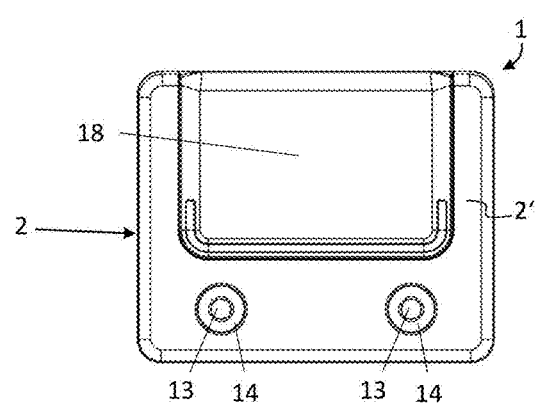

As in the first embodiment, the extension module 1 can be fastened by two screws that, however, are not shown in FIGS. 5 to 8. two screws, that are not shown in FIGS. 5 to 8. The housing 2 also has corresponding openings 13 for this purpose, as can be seen in FIGS. 7 and 8. In the upper part 2, annular depressions 14 are provided concentrically around the 13, in which the heads of the screws 3 are inserted so that they cannot be removed from the top of the housing and do not project from the upper surface of the upper part 2.

Since the housing 2 of the second expansion module 1 rests in more surface contact on the pump housing than the housing 2 of the first extension module 1, further connection formations between the extension module 1 and the pump housing in the form of four locking elements 4a, 4b are provided. These act at connection points that are at a greater spacing from the electrical interface 5 than the optional screws 3 and lie on the corners of a rectangle. The locking elements 4a, 4b project from the lower face of the housing 2, more precisely from the lower part 2", in order to be inserted through corresponding holes in the pump electronics housing.

The locking elements 4a, 4b are short posts that project in a block-like manner from the lower face of the housing 2 have a substantially square external shape, and are generally of C-section, which reduces shrinkage of the plastic after injection molding. Suitably, the housing 2 may be made of a thermoplastic material. The locking elements 4a, 4b taper downward, away from the housing 2 in the direction of its extension in the manner of a frustopyramid. This facilitates their insertion into the corresponding openings in the pump electronics housing.

As shown in particular in FIGS. 6 and 7, the locking elements 4a, 4b each have a laterally open recess 9 for the form-fitting reception of a blocking member that is held on the pump electronics housing. The recesses 9 each extend transversely to the longitudinal extension of the respective locking elements 4a, 4b. They are on the electrical interface 5 or the base 8 of the locking elements 4a, 4b and open outward away from each other. The recesses 9 of two adjacent locking elements 4a, 4b are aligned so that the blocking member can be an elongated bar and can be moved into the recesses 9 to lock the locking elements 4a, 4b. In other words, the blocking member is inserted after the extension module has been fitted onto the module onto the pump electronics housing, whereupon the blocking member is moved from a release position in which the openings in the pump electronics housing for the locking elements 4a, 4b are free to a blocking position in which the blocking member is in the locking position in which the blocking member is in the recesses 9. Thus, the expansion module 1 can no longer be removed from the locking from the locking position in the opposite direction to its insertion direction.

It can be seen from FIG. 5 that two of the locking elements 4a, more specifically the locking elements 4a near the base, project further from the lower face 2a of the housing 2, than the other locking elements 2b remote from the base. The locking elements close to the base 4a thereby advance when the extension module 1 is fitted and thus form a guide at an early stage in order to prevent the electrical interface 5 from canting or tilting. The lower face 2a of the housing 2 is completely flat. On the lower face 2a there is a label surface 17 on the lower face 2a, for example in order to carry a label or type plate with technical information on the expansion module. The upper side of the upper part 2 has a region 18 that is here slightly raised and is intended to receive, for example, a logo or an electric or electronic display of the expansion module 1. It should be noted that the foregoing description is given by way of example only for the purpose of illustration and in no way purposes of illustration and in no way limits the scope of protection of the invention. Features of the invention described as "may," "exemplary," "preferred," "optional," ideal," "advantageous," "where appropriate" or "suitable" are to be regarded as purely optional and also optional and do not limit the scope of protection that is determined exclusively by the claims. Insofar as elements, components, process steps, values or information are mentioned in the above description, process steps, values or information are mentioned that are known, obvious or foreseeable equivalents. known, obvious or foreseeable equivalents, these equivalents are embraced by the invention. Likewise, the invention includes any changes, variations or modifications to any of the examples that involve the substitution, addition, alteration or omission of elements, components, parts or omission of elements, components, process steps, values or information, as long as the invention is information, as long as the basic idea of the invention remains the same, regardless of whether the change idea of the invention is preserved, irrespective of whether the change, modification or alteration leads to a deterioration of an embodiment.

Although the foregoing description of the invention includes a variety of physical, intangible or process features in relation to one or more specific example(s) of the invention, these features may be example(s), these features may also be used in isolation from the specific example, in any example, at least in so far as they do not require the mandatory presence of other features. Conversely, they may be used in relation to one or more example(s) may be combined with each other and with other disclosed or undisclosed features as desired. with other disclosed or undisclosed features of the examples shown or not shown at least to the extent that the features are not mutually exclusive or do not lead to technical mutually exclusive or lead to technical incompatibilities.

We claim:

1. A plug-in electronic expansion module for pump electronics of a centrifugal pump held in a pump housing and serving for expanding the pump electronics with at least one additional function, the module comprising:
   a module housing having a lower face;
   connecting formations on the lower face for attachment of the module housing to the pump housing;
   module electronics encapsulated in the module housing and providing the additional function;
   a base on the lower face;
   an electrical interface on the module housing, connectable to the pump electronics, and including a flat tongue-shaped support projecting out of the base on the lower face of the module housing through an opening in the pump housing such that the module electronics and the module housing are outside the pump housing; and
   electrical traces forming contacts on the flat tongue-shaped support.

2. The expansion module according to claim 1, wherein the additional function is Bluetooth, WLAN, or cellular network.

3. The expansion module according to claim 1, wherein the additional function is Modbus, BACnet, LIN bus, or Ethernet.

4. The expansion module according to claim 1, wherein the contacts comprise first electrical contacts for supplying current to the module electronics and second electrical contacts for data transmission.

5. The expansion module according to claim 1, wherein the connection formations include two screws extending parallel to with the electrical interface.

6. The expansion module according to claim 1, wherein the connection formations include locking elements projecting from the lower face of the module housing for insertion through corresponding openings in the pump housing.

7. The expansion module according to claim 6, wherein the locking elements each have a recess for the form-fitting accommodation of a displaceable blocking member on a side of the pump electronics.

8. The expansion module according to claim 6, wherein at least one of the locking elements projects further from the lower face of the housing than at least one other of the locking elements.

9. The expansion module according to claim 1, wherein the housing forms a body in which the electronics are encapsulated.

10. The expansion module according to claim 1, wherein the base is integral with the lower face of the housing.

11. The expansion module according to claim 1, wherein the base is hollow and the support extends through the base.

12. The expansion module according to claim 1, wherein the base has at least at a free end opposite the lower face of the housing a trapezoidal single-symmetrical cross-sectional shape.

13. The expansion module according to claim 1, wherein the support is a printed-circuit board.

14. The expansion module according to claim 1, wherein the base carries a sealing ring at an end close to the housing.

15. The expansion module according to claim 1, the electrical contacts are on opposite faces of the support.

16. The expansion module according to claim 1, wherein at least one of the electrical contacts is closer to an edge of a free end of the support than the other contacts, and the at least one electrical contact is a ground contact.

17. The expansion module according to claim 1, wherein a spacing between a free end of the support remote from the housing and the lower face of the housing is 20 mm.

18. The centrifugal pump with pump electronics and an expansion module according to claim 1, wherein the electronics are plugged in to the expansion module.

19. A set of at least a first and a second extension module according to claim 1, wherein the base of the lower face of the housing of the second extension module is larger than the base of the lower face of the housing of the first expansion module, but the electrical interface and the arrangement of the connecting formations in relation to both interfaces are identical in the two expansion modules in such a way that optionally the first or the second expansion module can be plugged into the pump electronics.

20. A set of first and second expansion modules for pump electronics of a centrifugal pump held in a pump housing and serving for expanding the pump electronics with respective additional functions, the set comprising
   respective first and second module housings each having a lower face;
   respective first and second connecting formations on the lower faces for attachment of the respective module housing to the pump housing;
   respective first and second module electronics encapsulated in the module housings and providing respective additional functions;
   respective first and second bases on the lower faces;
   respective first and second electrical interfaces on the module housing, each connectable to the pump electronics, and each including a flat tongue-shaped support projecting out of the base on the lower face of the respective module housing through an opening in the pump housing such that the respective module electronics and the module housing are outside the pump housing; and
   respective first and second electrical traces forming contacts on the flat tongue-shaped supports, the base of the lower face of the housing of the second extension module being larger than the base of the lower face of the housing of the first expansion module, but the first and second electrical interfaces and the first and second connecting formations being identical in the first and second expansion modules such that optionally the first or the second expansion module can be plugged into the pump electronics.

* * * * *